March 16, 1965 P. CLEMENT ETAL 3,173,787
PHOTOSENSITIVE ELEMENT COMPRISING A HYDROPHOBIC SUPPORT, A HYDROPHILIC LAYER THEREON AND A LIGHT-SENSITIVE RESIN OVERCOAT LAYER AND PHOTOMECHANICAL PROCESSES THEREWITH
Filed May 18, 1959
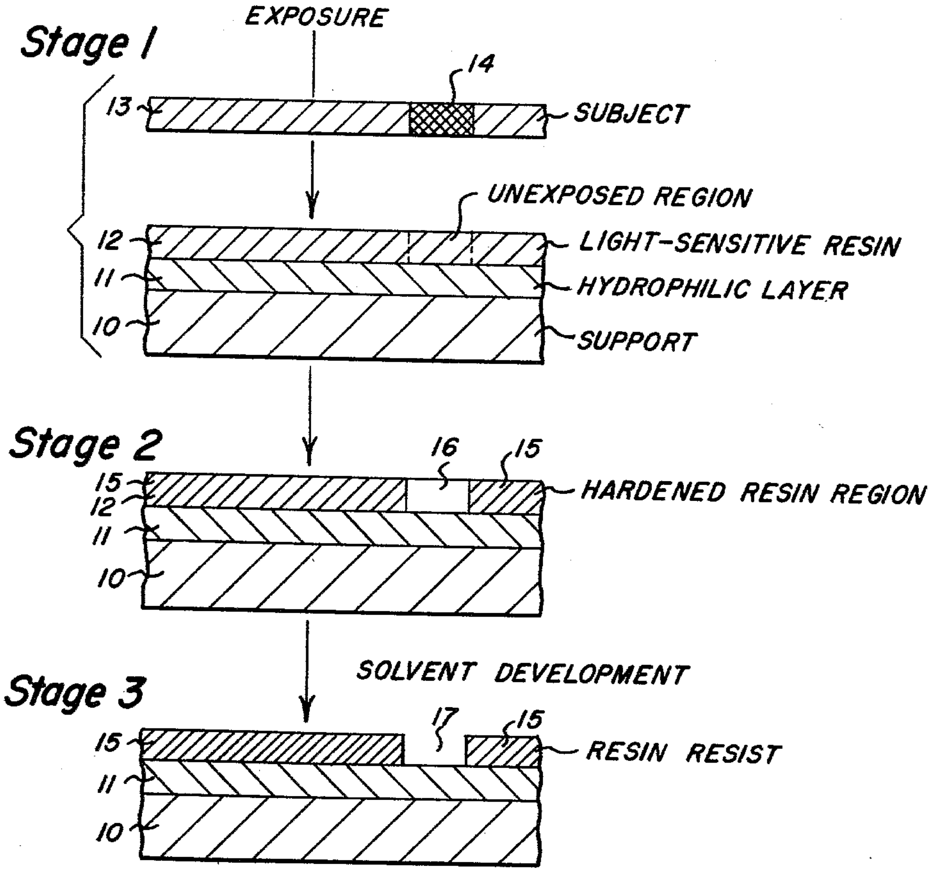
PIERRE CLEMENT
MARIE-JOSE' SUZANNE MICHIELS
INVENTORS
BY R. Frank Smith
Leonard E. Branchen
ATTORNEY & AGENT United States Patent Office 3,173,787

Patented Mar. 16, 1965

3,173,787

PHOTOSENSITIVE ELEMENT COMPRISING A HYDROPHOBIC SUPPORT, A HYDROPHILIC LAYER THEREON AND A LIGHT-SENSITIVE RESIN OVERCOAT LAYER AND PHOTOMECHANICAL PROCESSES THEREWITH

Pierre Clement and Marie-Jose Suzanne Michiels, Paris, France, assignors to Eastman Kodak Company, Rochester, N.Y., a corporation of New Jersey Filed May 18, 1959, Ser. No. 813,871
16 Claims. (Cl. 96—35)

The present invention relates to photography and more particularly to a new reproduction process and to a light-sensitive product for practicing the said process.

It is well-known to employ, for making etching resists, for lithographic and similar printing processes, and for copy reproductions such as the hectograph duplication process, a light-sensitive layer such as a gelatin, shellac, albumin, polyvinyl alcohol, and the like, impregnated with an alkali metal bichromate which is exposed to light to insolubilize the exposed areas and therby permit the selective removal with a suitable solvent of the unexposed areas and thus provide a resist type of relief image. Many variations of this process have been proposed. For example, cinnamic esters of polyvinyl alcohol have been employed as the light-sensitive materials on metal plates, the element so formed being exposed to atinic light under line or halftone subjects and the soluble unexposed areas selectively removed by solvent to leave insoluble polymeric resist images on the metal plates.

These light-sensitive coating materials have also been used in lithography, the resist areas which subsist after exposure and development constituting the printing areas.

The new process in accordance with the invention is remarkable inasmuch as it comprises photographically exposing a product comprising a support carrying a layer of a non-photosensitive organic material and a thin layer of a resin which is sensitive per se and which is capable of being insolubilized by exposure to light, the said organic material and the said photosensitive resin having different characteristics of solubility, removing the unexposed areas of the photosensitive resin by means of a solvent which is not a solvent of the said organic material, to bare the underlying areas of said organic material the non-photosensitive layer and using the areas so bared to create an image directly on the product itself, or indirectly by transfer onto a distinct support, of an agent present in such bared areas.

The product obtained may therefore, in itself, constitute a reproduction of the original or may be used as a matrix.

The overcoating layer of photosensitive resin is advantageously about one micron in maximum thickness. However, a greater thickness is possible, for example, five microns, although this is not advantageous either from the point of view of economy or from that of sensitivity, since the sensitivity of the product used in accordance with the invention is the greater as the photosensitive layer is the thinner.

The process in accordance with the invention may have various embodiments. For example, the undercoat of organic material can be preliminarily colored by dyeing or by incorporation of a pigment. According to another embodiment, the bared areas of the organic material undercoat are dyed, after washing away the unexposed areas of the overcoating layer, by a colorant which has no action on the insolubilized resin. Still according to another embodiment, a colloid constituting the undercoating layer in the bared areas is precipitated in the form of fine light-diffusing droplets. Thus, a difference of density is obtained between the areas containing the microprecipitated colloid and the colloidal areas which have been protected by the resist of photosensitive resin.

As stated above, it is also possible to use the product obtained as a matrix, for example, by transferring onto a receiving sheet, from the bared areas, a colored material or a material which may be colorless, capable of giving a colored material by chemical reaction with another compound in the presence of which the transfer is effected and which is generally present in the receiving sheet.

It should be noted that, in the embodiment wherein the image is obtained by transfer, such image results from the bared areas of the undercoating layer, whereas in usual lithographic reproduction, the printing areas are constituted by the resist.

In accordance with the invention, we prepare our novel and improved photographic resist materials by first coating a non-light-sensitive material such as gelatin, zein, casein, albumin, gum arabic, polyvinyl alcohol, polyvinylpyrrolidone, cellulose acetophthalate, acrylic acid polymers, etc., from an aqueous or aqueous alkaline dispersion thereof onto a sheeting material such as zinc or aluminum, paper, cellulose organic esters, polystyrene, polyesters such as polyethylene terephthalate, and the like, and after drying the coated layer, applying thereover in the dark a layer one micron or less in thickness of a photosensitive composition comprising a resinous material such as a polyester, a polyvinyl acetal, etc., in a suitable solvent in a concentration of about 5–15%, which becomes insoluble on exposure to actinic light such as ultraviolet light, the characteristics of solubility of the photosensitive resinous material differ from those of the non-photosensitive material constituting the undercoat so as to enable the overcoating layer to be coated and washed away without the undercoating layer being dissolved or swelled.

The light-sensitive photographic element thus formed can be used in various ways as more fully set forth hereinafter.

In the accompanying drawings, the various figures show in enlarged cross-sectional view the structure of a representative sensitive element of our invention at various stages in the process of producing intermediate printing plates or matrices having selected areas covered by the polymeric resist image.

Especially efficacious as resist materials are the resinous polyesters of the invention prepared from cinnamylidene malonic acid and dihydroxy compounds which consist essentially of the following recurring structural unit:

(I)

$$-\left[OC-\underset{\underset{CH-CH=R_1}{\|}}{C}-CO-O-R-O\right]_n-$$

where $n$ is an integer, R represents a hydrocarbon group, for example, an alkylene group containing from 2–12 carbon atoms, the group $—C_6H_4—$, the group $$—CH_2C_6H_4CH_2—$$

etc., and $R_1$ represents a radical free of functional substituents, i.e., groups which do not enter into polyesterification, such as an alkylidene, aralkylidene or heterocyclic group, for example, ethylidene, benzylidene, o-nitrobenzylidene, naphthylmethylene, furfurylidene, pyridylidene, quinolylidene, benzothiazolylidene, etc. groups. The resinous polyesters wherein R is an alkylene group represented by $(—CH_2—)_x$ wherein $x$ is an integer of 2–12 and $R_1$ is a benzylidene group are preferred, i.e. the polyesters of cinnamylidne malonic acid and $\alpha,\varpi$-alkylene glycols. Experience shows that the above types of photosensitive polyester resins, and more particularly, the species prepared with glycols such as 1,4-butanediol are especially well suited for reproduction purposes. In fact, these resinous polyesters may be deposited in a uniform, thin layer on the hydrophilic underlayer, e.g., on gelatin, if desired, without any intermediate subbing layer. Their sensitivity to light is sufficiently high to permit a normal exposure in photomechanical copying devices or in office-type photocopying devices. The mechanical properties of the exposed layer, its impermeability and the adherence of this layer to the hydrophilic undercoat layer are, morover, sufficient to assure several or more transfers from the matrix.

The above described resinous polyesters may be prepared by condensing a dibasic acid represented by the following formula:

(II) $R_1{=}CH{-}CH{=}C(COOH)_2$ wherein $R_1$ is as above defined, with a dihydroxy compound represented by the formula:

(III) HO—R—OH wherein R is as above defined, for example, a glycol containing from 2–12 carbon atoms, by heating a mixture of the components at ordinary pressure, followed by further heating under a vacuum (0.1 mm. Hg) at about 150–220° C. in the presence of a catalyst such as butyl titanate, antimony oxide, sulfuric acid, p-toluene-sulfonic acid, etc., until the desired resinous polyester is obtained. Typical dibasic acids of the above formula include crotonylidenemalonic acid, γ-methylcrotonylidenemalonic acid, o-nitrocinnamylidenemalonic acid, naphthylallylidenemalonic acid, 2-furfurylidenemalonic acid, N-methylpyridylidene-2-ethylidenemalonic acid, N-methylquinolylidene-2-ethylidenemalonic acid, N-methylbenzothiazolylidene-2-ethylidenemalonic acid, and the like, and functional derivatives thereof. Typical dihydroxy compounds of the above formula include aliphatic glycols such as ethylene glycol, 1,2-propanediol, 1,3-propanediol, 2,3-butanediol, 1,4-butanediol, 1,5-pentanediol, 2,2-dimethyl-1,3-propanediol-1,3,1,6-hexanediol, 1,10-decanediol, 1,12-dodecanediol, etc., and aromatic glycols such as hydroquinone, p-dihydroxymethylbenzene, etc. For further details concerning the preparation and the properties of the above resinous polyesters, reference can be had to United States Patent No. 2,956,878.

Other resinous materials that can be employed in the invention are the polyanthranyl methyl malonates consisting essentially of the following recurring structural unit:

(IV)

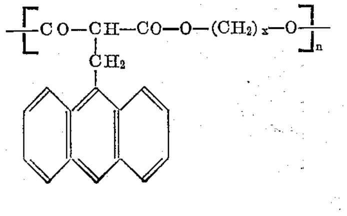

the polyanthranylene dipropionates consisting essentially of the structural unit:

(V)

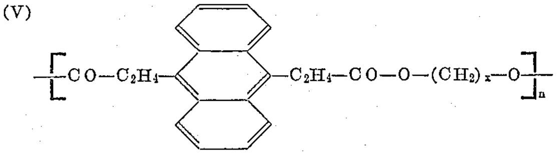

the polyesters of saturated dibasic fatty acids of 4–10 carbon atoms such as succinic, adipic, sebacic, etc. acids with di(p-hydroxyethoxybenzal)cyclopentanone and cyclohexanones consisting essentially of the following recurring structural units:

(VI)

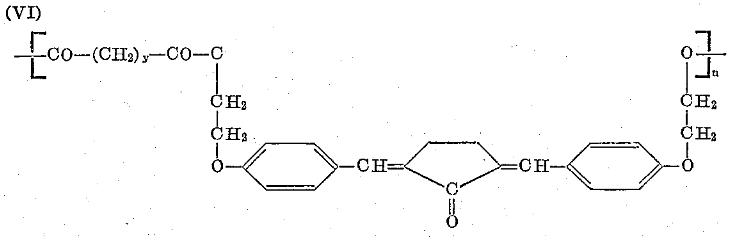

and (VII)

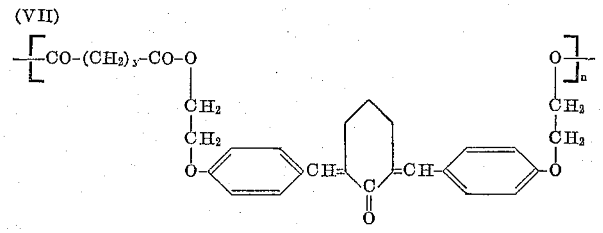

polydimethylsiliconate of 2,6-di(p-hydroxyethoxybenzal) cyclohexanone consisting essentially of the following recurring structural unit:

(VIII)

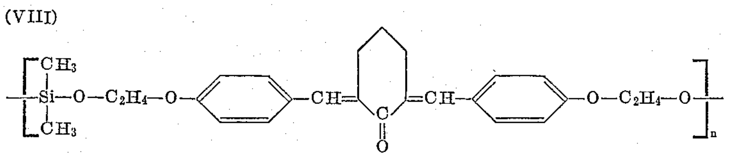

and poly-p-phenylene diacrylates consisting essentially of the following recurring structural unit:

(IX)

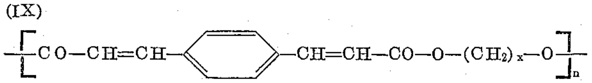

wherein the above formulas $x$ is as previously defined and $y$ represents an integer of 4–10. The polyesters of Formulas IV to IX can be prepared, in general, as previously described or by methods known to give resinous polyesters, e.g., by condensing the various intermediate dicarboxylic acids with appropriate glycols. Still other useful resinous resist materials include the benzaldehyde acetals such as o-nitrobenzaldehyde acetal of partially hydrolyzed polyvinylacetate, the cinnamoylated polyvinyl alcohols such as those described in L. M. Minsk et al. U.S. Patent 2,690,966, dated Oct. 5, 1954, and materials resulting from the reaction of a photosensitive alcohol on a styrene anhydride maleic copolymer, such as those described in A. C. Smith, Jr., et al. U.S. Patent 2,816,091, dated December 10, 1957, and C. C. Unruh et al. U.S. Patent 2,824,084, dated Feb. 18, 1958.

The above-described polyesters and other resinous materials are hard, transparent resins of variable coloration according to the starting compounds used. They must be kept in the dark. They may be used in a product in accordance with the invention, comprising a hydrophobic support carrying a hydrophilic organic colloidal layer, for example, gelatin, which is not photosensitive, and over which is applied a coating, approximately one micron in thickness, of such a photosensitive resin and particularly of a polyester of cinnamylidenemalonic acid and glycol. This latter product is very advantageous and, accordingly, is preferably used in accordance with the invention. As prepared, they are insoluble in water, but soluble in many organic solvents including acetone and other ketones, in aldehydes, in aromatic solvents, in chlorinated solvents such as chloroform, ethylene dichloride, etc., pyridine and the like. However, they are not soluble in aliphatic alcohols, ethyl ether, isopropyl ether and petroleum ether. After they have been exposed to light, the resins become insoluble in all of the aforementioned solvents and in acid baths used for engraving such as ferric chloride, nitric acid, etc. However, in actual practice, the solvent is selected so that it does not have a dissolving action on the hydrophilic colloidal underlayer. In this way, the latter is bared in the unexposed areas and an image may be made visible by dyeing the areas that are not protected by the resinous coating. An aqueous solution of a dye that diffuses in the hydrophilic underlayer can be used for this purpose In the course of the dyeing operation the underlayer may swell and reach, or even go beyond, the level of the overcoating layer.

Another particular class of photosensitive resin which may be used according to the invention comprises the quaternized poly-(alkylendiol paradialkylaminocinnamylidene-malonates) described in the first addition No. 70,498, dated Dec. 8, 1958, to French Patent No. 1,137,056, dated Jan. 7, 1957, in the name of M. J. S. Michiels et al. These compounds are water soluble; they may be coated on a water soluble product which constitutes the underlayer. Practicing the process is identical in all other respects, the coating and washing solvent and the dyeing bath medium being selected in an appropriate manner.

While all of the above-mentioned polyesters and other resinous materials of the invention are capable of givng useful relief images without sensitizers therefor, advantageously the sensitivity may be increased and correspondingly the required exposure time decreased by incorporating of a suitable sensitizer into the light-sensitive coating composition. As examples of suitable sensitizers, there can be mentioned 2-(benzoylmethylene)-1-methyl-β-naphthothiazole, 2 - benzoylcarbethoxymethylene-1-methyl-β-naphthothiazole, 1-carbethoxy-2-keto-3-methyl-2-azabenzathrone, tetrahydroacridine, rhodamine, Michler's ketone, diazidodibenzal acetone, 5-nitrobenzimidoazole, trimethylindolenine methyl iodide, p-nitrosodiethylaniline, dithenylidenecyclopentanone, 6 - nitromercaptobenzothiazole, 9-chloromethylanthracene, erosin, rose bengal, basic fuchsin, erythrosine, etc. Some sensitizers are described, for example, in Minsk et al. U.S. Patents 2,610,-120, dated Sept. 9, 1952 (nitro compounds); 2,670,285, dated Feb. 23, 1954 (quinones); 2,670,286, dated Feb. 23, 1954 (diaminobenzo-phenone imides, -diphenylmethanes, -diphenylketones, -diphenylcarbinols); 2,690,966, dated Oct. 5, 1954 (triphenylmethanes), and Robertson et al. U.S. 2,732,301, dated Jan. 24, 1956 (thiazoles, thiazolines, cyanine dyes, etc.), Also, it has been found that photosenstive products of especially high speeds are obtained when methyl-2-(N-methylbenzothiazolylidene) dithioacetate, of the formula:

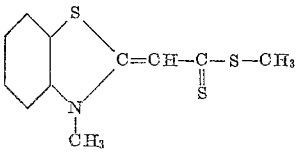

is used as the sensitizer (designated also as B.T.T.A.)

The following examples will serve to illustrate further our novel light-sensitive elements and methods of using them in the photomechanical reproduction art.

*Example 1*

A 7.5% solution of a polyester resin, of the 1,4-butane diol polycinnamylidene malonate type, in methylglycol acetate was prepared in non-actinic light. This solution also contained a sensitizer such as methyl-2(3-methylbenbothiazolylidene) dithioacetate which sensitizes the resin up to 500 mμ. A film support which had been subbed [preferably poly(ethylene glycol terephthalate)] and covered with a gelatin layer to an extent of between 50 mg. per sq. decimeter and 150 mg. per sq. decimeter was overcoated with the above solution. The average thickness of this overcoat of photosensitive resin was less than one micron after drying for 30 seconds at 50° C. The sensitive plate thus obtained was exposed to a positive plate (printed document or line or screen plate or microfilm) for 5–20 seconds at a distance of 20 cm. from a U.V. Mazda MA 125 watt mercury vapor lamp. The exposed plate was then treated with an organic solvent to remove the resin from the unexposed areas. Suitable solvents for this purpose include acetone, trichloroethylene, benzene, etc. or a mixture of solvents, for example, 70 parts of ethanol-30 parts of methylglycol acetate. The image obtained was faintly visible owing to the gelatin areas that had been bared in the unexposed areas. It was then tinted by means of an aqueous solution of a dye for gelatin such as used customarily in dye transfer processes.

Depending on the method of exposure used, the matrix can be preserved as a print or used to make dye transfers onto a suitable film support or paper. Having thus effected a complete transfer of the dye, the matrix may be impregnated again with the dye for the purpose of effecting complementary transfers. Also, the receiving papers or films may advantageously contain a mordant to facilitate the printing and to increase the contrast and definition.

The sensitized plate prepared and processed as above is shown in enlarged cross-sectional view in the Stage 1 of the accompanying drawings wherein layer 10 represents the support, layer 11 represents a hydrophilic layer, in this case gelatin, and layer 12 represents the overcoating of light-sensitive resin comprising in this case the polyester of cinnamylidene malonic acid and 1,4-butanediol. The subject to be reproduced is represented by transparent layer 13 containing an image 14 which is opaque to light. The result of the exposure is shown in Stage 2 wherein the exposed region 15 of layer 12 has become insolubilized leaving unaffected material in the unexposed region 16. After exposure and development, the unexposed area 16 was readily dissolved, thus leaving a resin resist 15 and the area 17 of bared gelatin shown as Stage 3 in the drawings. Application of a dye solution for gelatin tints the area 17. At this point, the plate can be retained as an original dye resist or used as a matrix for transferring the dye onto mordanted image receiving materials. To obtain a reversed autopositive image (a single copy) or autopositive images by contact thereof with receiving sheets, exposure is made through the back of the subject film, paper, glass plate, etc., to be reproduced directly onto the face of the sensitized plate, while to obtain a direct, non-reversed autopositive image (a single copy) the exposure is made through the face of the subject to be reproduced. Where the support material of the plate is transparent or translucent, exposure can also be made by the reflection method, i.e. the light is first passed through the rear support side of the plate and then reflected back from the face of the subject document or film onto the photosensitive resin layer to give a reversed autopositive image or non-reversed images on transference to a receiving material or to give direct non-reversed autopositive image (a single copy), respectively.

The exposed and developed plates can be used in related reproduction processes. For example, instead of dyeing the bared gelatin area 17 it can be treated with a chemical compound that is absorbed therein such as ferric chloride, which upon contact with a reagent such as gallic acid or tannin contained in the receiving sheet or in the swelling bath, yields a dye as a result of a dye-producing reaction. However, the gelatin layer 11 can also be used to carry a pigment such as carbon so that on swelling the area 17 transfer can be made directly onto a suitable receiving material.

*Example 2*

The process of above Example 1 was repeated, except that the support material was a baryta coated paper having a gelatin layer thereon that was sensitized by overcoating the gelatin layer with the resinous polyester of cinnamylidene malonic acid and 1,4-butanediol. A special case of using this method is the autopositive superimposition of a plate on an ordinary photograph with a silver halide base or on a color print on film or paper. Titles can be printed thereon by this means.

*Example 3*

A plate that was obtained according to Examples 1 or 2 may again be sensitized in darkness after having removed the exposed layer of resin with a solvent that is more active than the washing solvent. A light rubbing action with the aid of cotton facilitates this removal. This technique may be repeated an unlimited number of times, thus making it possible to superimpose images. This process may be used advantageously for certain photographic montages, particularly if each of the prints is tinted with a different dye. In this way, it is possible to obtain a multicolor image on the same gelatin support by a subtractive method, starting with three screened positive separations.

*Example 4*

This example illustrates the preparation of an intaglio printing plate wherein a pigment is incorporated in the gelatin undercoat layer.

A baryta coated paper was coated with an aqueous 5% gelatin solution containing finely dispersed carbon black in sufficient quantity to give, after drying, a density by reflection greater than 1.5.

Also prepared was a 7.5% solution of the polyester of cinnamylidene malonic acid and 1,4-butanediol in methylglycol acetate under inactive light conditions. This solution also contained 2-(3-methylbenzothiazolylidene) methyldithioacetate which sensitized the resin up to 500 m$\mu$.

The above coated baryta paper was then overcoated, under inactive light conditions, with the polyester solution and dried at 50° C. for a period of 30 seconds. The thickness of the overcoat was of the order of one micron. The resulting sensitized paper element was then exposed behind a positive plate (printed document or line or screen plate) for a period of one minute to sunlight or 20 seconds to a U.V. Mazda MA 125 watt mercury vapor lamp at a distance of 20 cm.

The exposed element was next developed by immersing it for 5 seconds in a solvent for the resin (acetone or trichloroethylene, benzene or a mixture of 70 parts ethanol and 30 parts of methylglycol acetate). The developed plate or matrice was next immersed for 30 seconds in water at 28° C. whereby an intaglio type of image was formed by the swelling of the gelatin in the non-exposed areas. A half score of positive prints were obtained therefrom on ordinary typewritten paper by the usual transfer technique. Good contact between the matrix and the receiving sheets was obtained by pressing with a rubber faced platen.

*Example 5*

A photosensitive paper prepared as in above Example 4 can also be employed to obtain a single positive plate by using a negative document or line or screen plate. The document is exposed similar to a silver negative-positive technique; the matrix is obtained by developing with an appropriate organic solvent to remove the unexposed areas of the resin and is then washed with water at 35° C. to eliminate the unexposed gelatin areas and to retain only the regions protected by the insolubilized resin.

In place of the carbon black in the photosensitive papers described in above Examples 4 and 5, there can be substituted an organic dye or a compound which is not colored but which is capable of reacting with a compound in the paper receiving sheet to form a colored image (coupling agent, precipitated mineral, etc.). Advantageously, the paper receiving sheet contains a mordant to fix the colors and thereby obtain good definition in the colored images. Also, the processes of these examples can be carried out by simultaneous development and transfer by suitable mixtures of gelatin and a plasticizing material such as carbowax, glycerol, pentaerythritol, water-soluble acrylic polymers, etc. and by selecting an organic developing solvent which swells the gelatin undercoat sufficiently to permit transfer without further imbibition. Other of the mentioned hydrophilic materials can be used to replace the gelatin are, for example, zein or appropriate synthetic polymers that are transferable after swelling in a solvent which do not affect the insolubilized photosensitive layer, such as alcohol-water mixtures in the case of zein.

*Examples 6–9*

These examples illustrate the increased sensitivity obtained as compared with the process of Example 1 by increasing the ratio of sensitizer to the photosensitive resin and by decreasing the thickness of the photosensitive layer, depicted in the drawings as 12, to less than one micron, i.e. to an optimum adjusted to the covering power (mechanical resistance and porosity) of the reticulated photosensitive polyester resin. In the case of the polyester of cinnamylidene malonic acid and 1,4-butanediol, it appears that the deviations from the reciprocity law are large which permits very short and highly intense exposures without the risk of fogging by artificial incandescent light sources (100 lux).

*Ex. 6*.—A gelatin coated paper of the dye transfer type was varnished by wiping thereover with a wad of cotton which had been previously soaked with a 2.5% solution of the polyester of cinnamylidene malonic acid and 1,4-butanediol in methylglycol acetate which also contained 12% of 2-(3-methyl benzothiazolylidene) dithiomethylacetate, based on the weight of the polyeter resin. After drying, the paper was exposed behind a positive for a period of only 2 seconds at a distance of 30 cm. for a U.V. Mazda MA 125 watt mercury vapor lamp. The plate obtained was then developed with an organic solvent and tinted with an aqueous dye solution in accordance with the technique described in Example 1, thereby producing an excellent resist image in color.

*Ex. 7*.—A photosensitive paper prepared as in above Example 6 was exposed behind a positive at a distance of 50 cm. to a flash lamp (Philips Photoflux, type PF 25, class M). The plate was then developed and tinted according to the preceding technique.

*Ex. 8*.—An enlargement was made on 40 x 50 cm. paper type of dye transfer which had been sensitized by varnishing with a polyester of cinnamylidene malonic acid and 1,4-butanediol from a 6 x 9 cm. positive line or screen plate, by exposing through an enlarger for a period of 1 minute 30 seconds at a distance of the plate to image of 2 m. 50 cm. The light source was a 130 volt 500 watt lamp. The enlarged image was developed and tinted according to the preceding technique.

*Ex. 9*.—A photosensitive paper prepared as in above Example 6 was placed in a photographic camera and exposed one minute at $f/2$ in ordinary sunlight. The reversed positive image obtained after development and tinting had a very high contrast.

*Example 10-12*

These examples illustrate in more detail the mentioned technique wherein there is included in the hydrophilic undercoat a compound which is not colored but which on contact with a receiving sheet containing a compound micron in thickness, of such a photosensitive resin and particularly of a polyester of cinnamylidenemalonic acid and glycol. This latter product is very advantageous and, accordingly, is preferably used in accordance with the invention. As prepared, they are insoluble in water, but soluble in many organic solvents including acetone and other ketones, in aldehydes, in aromatic solvents, in chlorinated solvents such as chloroform, ethylene dichloride, etc., pyridine and the like. However, they are not soluble in aliphatic alcohols, ethyl ether, isopropyl ether and petroleum ether. After they have been exposed to light, the resins become insoluble in all of the aforementioned solvents and in acid baths used for engraving such as ferric chloride, nitric acid, etc. However, in actual practice, the solvent is selected so that it does not have a dissolving action on the hydrophilic colloidal underlayer. In this way, the latter is bared in the unexposed areas and an image may be made visible by dyeing the areas that are not protected by the resinous coating. An aqueous solution of a dye that diffuses in the hydrophilic underlayer can be used for this purpose In the course of the dyeing operation the underlayer may swell and reach, or even go beyond, the level of the overcoating layer.

Another particular class of photosensitive resin which may be used according to the invention comprises the quaternized poly-(alkylendiol paradialkylaminocinnamylidene-malonates) described in the first addition No. 70,498, dated Dec. 8, 1958, to French Patent No. 1,137,056, dated Jan. 7, 1957, in the name of M. J. S. Michiels et al. These compounds are water soluble; they may be coated on a water soluble product which constitutes the underlayer. Practicing the process is identical in all other respects, the coating and washing solvent and the dyeing bath medium being selected in an appropriate manner.

While all of the above-mentioned polyesters and other resinous materials of the invention are capable of givng useful relief images without sensitizers therefor, advantageously the sensitivity may be increased and correspondingly the required exposure time decreased by incorporating of a suitable sensitizer into the light-sensitive coating composition. As examples of suitable sensitizers, there can be mentioned 2-(benzoylmethylene)-1-methyl-β-naphthothiazole, 2-benzoylcarbethoxymethylene-1-methyl-β-naphthothiazole, 1-carbethoxy-2-keto-3-methyl-2-azabenzathrone, tetrahydroacridine, rhodamine, Michler's ketone, diazidodibenzal acetone, 5-nitrobenzimidoazole, trimethylindolenine methyl iodide, p-nitrosodiethylaniline, dithenylidenecyclopentanone, 6-nitromercaptobenzothiazole, 9-chloromethylanthracene, erosin, rose bengal, basic fuchsin, erythrosine, etc. Some sensitizers are described, for example, in Minsk et al. U.S. Patents 2,610,120, dated Sept. 9, 1952 (nitro compounds); 2,670,285, dated Feb. 23, 1954 (quinones); 2,670,286, dated Feb. 23, 1954 (diaminobenzo-phenone imides, -diphenylmethanes, -diphenylketones, -diphenylcarbinols); 2,690,966, dated Oct. 5, 1954 (triphenylmethanes), and Robertson et al. U.S. 2,732,301, dated Jan. 24, 1956 (thiazoles, thiazolines, cyanine dyes, etc.), Also, it has been found that photosenstive products of especially high speeds are obtained when methyl-2-(N-methylbenzothiazolylidene) dithioacetate, of the formula:

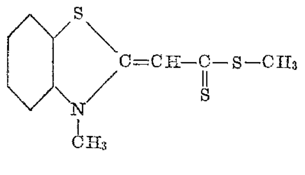

is used as the sensitizer (designated also as B.T.T.A.)

The following examples will serve to illustrate further our novel light-sensitive elements and methods of using them in the photomechanical reproduction art.

*Example 1*

A 7.5% solution of a polyester resin, of the 1,4-butane diol polycinnamylidene malonate type, in methylglycol acetate was prepared in non-actinic light. This solution also contained a sensitizer such as methyl-2(3-methylbenbothiazolylidene) dithioacetate which sensitizes the resin up to 500 mμ. A film support which had been subbed [preferably poly(ethylene glycol terephthalate)] and covered with a gelatin layer to an extent of between 50 mg. per sq. decimeter and 150 mg. per sq. decimeter was overcoated with the above solution. The average thickness of this overcoat of photosensitive resin was less than one micron after drying for 30 seconds at 50° C. The sensitive plate thus obtained was exposed to a positive plate (printed document or line or screen plate or microfilm) for 5–20 seconds at a distance of 20 cm. from a U.V. Mazda MA 125 watt mercury vapor lamp. The exposed plate was then treated with an organic solvent to remove the resin from the unexposed areas. Suitable solvents for this purpose include acetone, trichloroethylene, benzene, etc. or a mixture of solvents, for example, 70 parts of ethanol-30 parts of methylglycol acetate. The image obtained was faintly visible owing to the gelatin areas that had been bared in the unexposed areas. It was then tinted by means of an aqueous solution of a dye for gelatin such as used customarily in dye transfer processes.

Depending on the method of exposure used, the matrix can be preserved as a print or used to make dye transfers onto a suitable film support or paper. Having thus effected a complete transfer of the dye, the matrix may be impregnated again with the dye for the purpose of effecting complementary transfers. Also, the receiving papers or films may advantageously contain a mordant to facilitate the printing and to increase the contrast and definition.

The sensitized plate prepared and processed as above is shown in enlarged cross-sectional view in the Stage 1 of the accompanying drawings wherein layer 10 represents the support, layer 11 represents a hydrophilic layer, in this case gelatin, and layer 12 represents the overcoating of light-sensitive resin comprising in this case the polyester of cinnamylidene malonic acid and 1,4-butanediol. The subject to be reproduced is represented by transparent layer 13 containing an image 14 which is opaque to light. The result of the exposure is shown in Stage 2 wherein the exposed region 15 of layer 12 has become insolubilized leaving unaffected material in the unexposed region 16. After exposure and development, the unexposed area 16 was readily dissolved, thus leaving a resin resist 15 and the area 17 of bared gelatin shown as Stage 3 in the drawings. Application of a dye solution for gelatin tints the area 17. At this point, the plate can be retained as an original dye resist or used as a matrix for transferring the dye onto mordanted image receiving materials. To obtain a reversed autopositive image (a single copy) or autopositive images by contact thereof with receiving sheets, exposure is made through the back of the subject film, paper, glass plate, etc., to be reproduced directly onto the face of the sensitized plate, while to obtain a direct, non-reversed autopositive image (a single copy) the exposure is made through the face of the subject to be reproduced. Where the support material of the plate is transparent or translucent, exposure can also be made by the reflection method, i.e. the light is first passed through the rear support side of the plate and then reflected back from the face of the subject document or film onto the photosensitive resin layer to give a reversed autopositive image or non-reversed images on transference to a receiving material or to give direct non-reversed autopositive image (a single copy), respectively.

The exposed and developed plates can be used in related reproduction processes. For example, instead of dyeing the bared gelatin area 17 it can be treated with a chemical compound that is absorbed therein such as ferric chloride, which upon contact with a reagent such as gallic acid or tannin contained in the receiving sheet or in the swelling bath, yields a dye as a result of a dye-producing reaction. However, the gelatin layer 11 can also be used to carry a pigment such as carbon so that on swelling the area 17 transfer can be made directly onto a suitable receiving material.

*Example 2*

The process of above Example 1 was repeated, except that the support material was a baryta coated paper having a gelatin layer thereon that was sensitized by overcoating the gelatin layer with the resinous polyester of cinnamylidene malonic acid and 1,4-butanediol. A special case of using this method is the autopositive superimposition of a plate on an ordinary photograph with a silver halide base or on a color print on film or paper. Titles can be printed thereon by this means.

*Example 3*

A plate that was obtained according to Examples 1 or 2 may again be sensitized in darkness after having removed the exposed layer of resin with a solvent that is more active than the washing solvent. A light rubbing action with the aid of cotton facilitates this removal. This technique may be repeated an unlimited number of times, thus making it possible to superimpose images. This process may be used advantageously for certain photographic montages, particularly if each of the prints is tinted with a different dye. In this way, it is possible to obtain a multicolor image on the same gelatin support by a subtractive method, starting with three screened positive separations.

*Example 4*

This example illustrates the preparation of an intaglio printing plate wherein a pigment is incorporated in the gelatin undercoat layer.

A baryta coated paper was coated with an aqueous 5% gelatin solution containing finely dispersed carbon black in sufficient quantity to give, after drying, a density by reflection greater than 1.5.

Also prepared was a 7.5% solution of the polyester of cinnamylidene malonic acid and 1,4-butanediol in methylglycol acetate under inactive light conditions. This solution also contained 2-(3-methylbenzothiazolylidene) methyldithioacetate which sensitized the resin up to 500 m$\mu$.

The above coated baryta paper was then overcoated, under inactive light conditions, with the polyester solution and dried at 50° C. for a period of 30 seconds. The thickness of the overcoat was of the order of one micron. The resulting sensitized paper element was then exposed behind a positive plate (printed document or line or screen plate) for a period of one minute to sunlight or 20 seconds to a U.V. Mazda MA 125 watt mercury vapor lamp at a distance of 20 cm.

The exposed element was next developed by immersing it for 5 seconds in a solvent for the resin (acetone or trichloroethylene, benzene or a mixture of 70 parts ethanol and 30 parts of methylglycol acetate). The developed plate or matrice was next immersed for 30 seconds in water at 28° C. whereby an intaglio type of image was formed by the swelling of the gelatin in the non-exposed areas. A half score of positive prints were obtained therefrom on ordinary typewritten paper by the usual transfer technique. Good contact between the matrix and the receiving sheets was obtained by pressing with a rubber faced platen.

*Example 5*

A photosensitive paper prepared as in above Example 4 can also be employed to obtain a single positive plate by using a negative document or line or screen plate. The document is exposed similar to a silver negative-positive technique; the matrix is obtained by developing with an appropriate organic solvent to remove the unexposed areas of the resin and is then washed with water at 35° C. to eliminate the unexposed gelatin areas and to retain only the regions protected by the insolubilized resin.

In place of the carbon black in the photosensitive papers described in above Examples 4 and 5, there can be substituted an organic dye or a compound which is not colored but which is capable of reacting with a compound in the paper receiving sheet to form a colored image (coupling agent, precipitated mineral, etc.). Advantageously, the paper receiving sheet contains a mordant to fix the colors and thereby obtain good definition in the colored images. Also, the processes of these examples can be carried out by simultaneous development and transfer by suitable mixtures of gelatin and a plasticizing material such as carbowax, glycerol, pentaerythritol, water-soluble acrylic polymers, etc. and by selecting an organic developing solvent which swells the gelatin undercoat sufficiently to permit transfer without further imbibition. Other of the mentioned hydrophilic materials can be used to replace the gelatin are, for example, zein or appropriate synthetic polymers that are transferable after swelling in a solvent which do not affect the insolubilized photosensitive layer, such as alcohol-water mixtures in the case of zein.

*Examples 6–9*

These examples illustrate the increased sensitivity obtained as compared with the process of Example 1 by increasing the ratio of sensitizer to the photosensitive resin and by decreasing the thickness of the photosensitive layer, depicted in the drawings as 12, to less than one micron, i.e. to an optimum adjusted to the covering power (mechanical resistance and porosity) of the reticulated photosensitive polyester resin. In the case of the polyester of cinnamylidene malonic acid and 1,4-butanediol, it appears that the deviations from the reciprocity law are large which permits very short and highly intense exposures without the risk of fogging by artificial incandescent light sources (100 lux).

*Ex. 6.*—A gelatin coated paper of the dye transfer type was varnished by wiping thereover with a wad of cotton which had been previously soaked with a 2.5% solution of the polyester of cinnamylidene malonic acid and 1,4-butanediol in methylglycol acetate which also contained 12% of 2-(3-methyl benzothiazolylidene) dithiomethylacetate, based on the weight of the polyeter resin. After drying, the paper was exposed behind a positive for a period of only 2 seconds at a distance of 30 cm. for a U.V. Mazda MA 125 watt mercury vapor lamp. The plate obtained was then developed with an organic solvent and tinted with an aqueous dye solution in accordance with the technique described in Example 1, thereby producing an excellent resist image in color.

*Ex. 7.*—A photosensitive paper prepared as in above Example 6 was exposed behind a positive at a distance of 50 cm. to a flash lamp (Philips Photoflux, type PF 25, class M). The plate was then developed and tinted according to the preceding technique.

*Ex. 8.*—An enlargement was made on 40 x 50 cm. paper type of dye transfer which had been sensitized by varnishing with a polyester of cinnamylidene malonic acid and 1,4-butanediol from a 6 x 9 cm. positive line or screen plate, by exposing through an enlarger for a period of 1 minute 30 seconds at a distance of the plate to image of 2 m. 50 cm. The light source was a 130 volt 500 watt lamp. The enlarged image was developed and tinted according to the preceding technique.

*Ex. 9.*—A photosensitive paper prepared as in above Example 6 was placed in a photographic camera and exposed one minute at $f/2$ in ordinary sunlight. The reversed positive image obtained after development and tinting had a very high contrast.

*Example 10-12*

These examples illustrate in more detail the mentioned technique wherein there is included in the hydrophilic undercoat a compound which is not colored but which on contact with a receiving sheet containing a compound capable of reacting therewith in situ forms a violet dye. The advantage of this process over the dye tinting method is that lightly colored developers which are non-caustic and do not dye the hands can be employed. For this purpose, various ferric salts can be used in the gelatin layer while a tanning agent such as gallic acid or tannin can be incorporated in the receiving sheet. However, experience has shown that ferric salts tend to tan certain hydrophilic colloids at the concentrations used thereby resulting in impractical coatings. Also, complex colors result with gelatin, the color being more dense as the concentration of gelatin increases. In contrast, ferrous salts which oxidize in the air during the course of the procedure give darker dyes with gallic acid or tanning and are preferable. The tinning of the photosensitive papers by the ferrous salts, stabilized with a reducing agent, takes place only slowly on keeping. Suitable stabilizers in combination with ferrous sulfate or Mohr's salt (ferrous sulfate and ammonium sulfate) include hydroxylamine hydrochloride, hydrazine sulfate and stannous chloride, the latter being particularly useful.

*Ex. 10.*—A warm, aqueous 7.5% solution of gelatin containing 5% of Mohr's salt (0.7 iron content) and 1.5% of stannous chloride (approximately 1 mg. iron/$dm.^2$) was coated onto a baryta coated paper in the proportions of 150 mg./$dm.^2$ of surface. After drying, the gelatin layer was overcoated by swabbing with cotton soaked in a 5% solution of the polyester of cinnamylidene malonic acid and 1,4-butanediol, sensitized with 2-(3-methyl benzothiazolylidene) methyl dithioacetate under inactive light conditions. The dried photosensitized paper was then exposed behind a positive for three seconds at 15 cm. to an U.V. Mazda MA 125 watt mercury vapor lamp and developed in acetone and then developed further with a 1.5% aqueous gallic acid solution (not wetting the back of the paper) whereby a violet gray colored image was obtained.

In place of the gallic acid in the above example, there may be substituted a 2.5% aqueous solution of tannin or a mixture of gallic acid and tannin. Also, other iron salt reagents can be substituted, for example, potassium ferrocyanide (for ferric salt), potassium ferricyanide (for ferrous salt stabilized with a reducing agent), the image obtained being blue in color. Furthermore, the adherence of the polyester resin to the gelatin under-coat containing salts of iron appears to be superior to that observed for dye transfer type papers.

*Ex. 11.*—A photosensitive paper prepared and exposed as described in above Example 10 was simultaneously developed for the removal of unexposed polyester resin and formation of a dye image in the bared gelatin areas by treating with the following composition:

| | | |
|---|---|---|
| Water | cc | 150 |
| Gallic acid | g | 0.50 |
| Ascorbic acid | g | 0.01 |
| Carboxymethyl cellulose | g | 15 |
| Butyl acetate | cc | 10 |

The resulting plate was then rinsed with water. In preparing the above composition, the components are preferably added to a mixer in the indicated order.

*Ex 12.*—A 2% solution of a polyamide dissolved in a mixture 80 alcohol-20 water (or alcohol-chlorinated hydrocarbon solvent) containing 0.3% of anhydrous ferric chloride (ferric chloride does not tan polyamide under these conditions) was coated over a baryta type of paper. Over this was coated a thin layer of the polyester of cinnamylidene malonic acid and 1,4-butanediol and the element exposed and developed in accordance with the procedure of above Example 10. However, in this case, a little alcohol was added to the developer bath to permit better penetration of the gallic acid (or tannin) into the polyamide undercoat layer.

In place of the baryta paper in the above example, there may be substituted a thin paper which is first varnished with the same soluble type of polyamide, the paper then being immediately put into an oven at 100° C. This treatment produces a paper base which is practically impermeable to water.

*Examples 13–17*

These examples illustrate the process wherein the removal of the unexposed resin and the penetration of coloring matter into the bared gelatin areas are carried out in a single stage treatment.

*Ex. 13.*—A dye transfer type of paper having a gelatin thereon was varnished by swabbing with cotton soaked with a 2.5% solution of the polyester of cinnamylidene malonic acid and 1,4-butanediol in methylglycol acetate containing 12% based on the weight of the resin of 2-(3- methylbenzothiazolylidene) methyldithioacetate. This paper was exposed behind a positive line or screen plate at 50 cm. to a flash lamp (Philips Photoflux, type PM 25, class M). After the exposure, the plate was placed in a vertical position and over a 10 second period it was subjected to a fine stream of the following composition:

| | | |
|---|---|---|
| Acetone | cc | 1000 |
| Water | cc | 500 |
| Benzyl alcohol | cc | 20 |
| Coloring material | g | 3 |

Under these conditions, the concentration of the acetone is sufficient to dissolve the unexposed resin. During the treament a part of the acetone evaporates from the surface of the plate and thus the concentration of water plus coloring material becomes sufficient to swell and color the gelatin so that the image appears. The benzyl alcohol plays an important role in the sense that the insolubilized polyester resin is not wetted by the solution during the dyeing, the gelatin areas absorbing all of the dye from the solution and thereby dispensing with any subsequent washing of the image. The total developing time is of the order of 20 seconds.

*Ex. 14.*—A photosensitive element prepared according to above Example 13 was treated after exposure with a viscous solution prepared in a mixer and having the following composition:

| | | |
|---|---|---|
| Water | cc | 700 |
| Carboxymethyl cellulose (medium viscosity) | g | 15 |
| Alkanol B (an alkylnaphthalene sodium sulfonate) | g | 0.05 |
| Coloring material | g | 3 |
| Butyl acetate | cc | 20 |

The image appeared in several seconds. The excess of developer was removed by drying with filter paper or by rinsing with water. Any yellow stain remaining from the developer can be removed with a little acetone. This technique of development has the advantages of using a non-inflammable and high viscosity developer and a very practical mode of operation. The organic dispersing agent is in the form of an emulsion in the aqueous colloidal phase and acts in the role of a solvent for the polyester while the bared gelatin absorbes the color from the aqueous phase.

*Ex. 15.*—A photosensitive element prepared according to Example 13 was treated after exposure with a gel prepared in a mixer and having the following composition:

| | | |
|---|---|---|
| Water | cc | 400 |
| Carboxymethyl cellulose | g | 40 |
| Alkanol B | g | 0.05 |
| Coloring material | g | 3 |
| Butyl acetate | cc | 30 |

This paste, which can be kept in a tube, was applied to the surface in the proportions of 1 cc./100 $cm.^2$. This application may be carried out by any process which does not provoke mechanical abrasion of the exposed areas e.g.

by pressure rollers. The image appears after about 10 seconds of treatment. The excess of developer was eliminated by rapid wiping of the surface with cotton or by rinsing in water. This paste developer has the same advantages as that cited in the preceding example—nonflammability and rapidity of processing.

*Ex. 16.*—A photosensitive element prepared according to above Example 13 was treated after exposure with a viscous solution prepared in a mixer and having the following composition:

| | | |
|---|---|---|
| Water | cc | 300 |
| Carbopol 934 [1] | g | 2 |
| Coloring material | g | 2 |
| Butyl acetate | cc | 20 |
| Triethylamine | cc | 2 |

[1] A synthetic hydrophilic vinyl polymer with high concentration of carboxyl groups.

The image appeared immediately and the excess developer was eliminated by drying with filter paper or by rinsing with water.

*Ex. 17.*—A photosensitive element prepared according to above Example 13 was treated after exposure with the following composition:

| | | |
|---|---|---|
| Water | cc | 200 |
| Alkanol B | g | 0.05 |
| Gelatin | g | 15 |
| Coloring material | g | 1.5 |
| Butyl acetate | cc | 30 |

The plate was developed in several seconds of contact with the hydrated gel.

Other organic solvent developers that can be used in emulsion form in the above aqueous formulas include ethyl acetate, amyl acetate, methylglycol acetate, benzyl acetate, ethyl benzoate, benzyl alcohol, butyl phthalate and the like. The coloring materials employed include those customarily used in dye transfer processes either alone or in admixture with one another.

*Examples 18–21*

These examples illustrate photosensitive materials wherein cellulose acetophthalate is employed as a substitute for the gelatin undercoat and wherein the support material is a cellulose organic ester. We have found that certain solvents for the polyester of cinnamylidene malonic acid and 1,4-butanediol produce very uniform varnishes having an excellent adherence for and permitting the deposition of this photosensitive resin upon an undercoat layer of certain polymers, for example, cellulose esters such as cellulose acetophthalate. Besides, the cellulose acetophthalate has the advantage of being insoluble in water but soluble in a weak aqueous alkaline solution. Also, the cellulose acetophthalate may be tinted with dyes or pigmented especially with a carbon black such as is used in antihalation backings in photographic films. Advantageously, the layer is waxed with material having a low fusion point such as carnauba wax. Accordingly, it can advantageously replace gelatin for certain applications of the invention.

*Ex. 18.*—A cellulose triacetate film that had previously been coated with a solution of pigmented cellulose acetophthalate and then waxed, was sensitized by wiping with cotton which had been soaked with the following solution:

5 g. of the polyester of cinnamylidene malonic acid and 1,4-butanediol and 0.25 g. of 2-(3-methylbenzothiazolylidene) methyldithioacetate in 100 cc. of a mixture of 50/50 methyl isobutyl ketone and xylene.

After drying in warm air, the film was exposed for a period of three seconds behind a line or screen positive plate at 20 cm. to U.V. Mazda MA 125 watt mercury vapor lamp. The plate was then developed by immersing for five seconds in trichloroethylene. The image which formed was next transferred onto a gelatin coated receiving paper by means of an appropriate duplicating machine comprising two pressure rollers and supplied with a 0.5% aqueous sodium carbonate solution. By this means, it was possible to obtain two successive transfer copies of very good definition. The matrix is the negative image of the plate reproduced.

A variation of the above procedure is to transfer the image after development in trichloroethylene by application of heat, e.g. by a flatiron at 150–200° C. upon ordinary paper which has been first soaked with a dilute aqueous solution of ammonium carbonate. Another variation after exposure is to develop and transfer the image in a single operation by contacting the exposed film with a treated receiving paper having an alkaline paste thereon containing a solution or dispersion of a suitable organic developer, e.g. a paste such as described in above Example 15.

*Ex. 19.*—A 3% solution of cellulose acetophthalate pigmented with carbon black was prepared with the following mixture:

| | Percent |
|---|---|
| Acetone | 12 |
| Ethanol | 47 |
| Methylglycol | 26 |
| Water | 15 |
| | 100 |

This composition was applied onto a baryta paper, dried with warm air at 60° C. and waxed with a 5% solution of carnauba wax in trichloroethylene. It was then sensitized, exposed and utilized in similar manner as described in above Example 18.

*Ex. 20.*—An identical result as that of Examples 18 and 19 may be obtained with an undercoat of tinted cellulose acetophthalate or pigmented type by incorporating a coloring material which is not soluble in the solvent used for coating the photosensitive resin. Positive separations of a plate in colors may also be reproduced upon matrices having undercoat layers colored yellow, magenta or cyan, respectively. The three matrices discharged upon the same receiving sheet give a colored positive image forming a test print for off-set printing.

*Ex. 21.*—According to this example, the development of a matrix by means of a slightly alkaline medium is used directly to obtain images of negative line and screen plates. A sensitized film identical to that of Example 18 was exposed behind a negative line or screen plate for a period of three seconds at a distance of 20 cm. to a U.V. Mazda MA 125 watt mercury vapor lamp and developed by immersing for five seconds in trichloroethylene. After drying, the image was further developed by soaking for one minute in a 0.5% aqueous sodium carbonate solution, followed by washing in a current of water. The image obtained was a positive of good definition and heavy density. It can be used as a new medium for reproductions.

Also, a screened image may be obtained under the preceding conditions by starting with a continuous pattern negative by interposing a magenta screen at the time of the printing, the time in this case being of the order of 30 seconds.

In place of the cellulose acetophthalate in the above Examples 18–21, there may be substituted other polymers such as polyvinyl phthalate, copolymers of acrylic acid-methyl acrylate, copolymers of acrylic acid-acrylonitrile or cellulose ethylphthalate.

*Examples 22–52*

These examples illustrate embodiments of the process in accordance with the invention, in which there is used a product having an organophilic layer. Of course in this case, the solvent of the photosensitive coating material constituting the overcoating layer is not itself a solvent of the underlayer.

In general, in this last type of products, the underlayer is constituted by the support.

*Ex. 22.*—A layer of cellulose triacetate is coated with a 5% solution of 1.4 butanediol polycinnamylidene malonate in a 1:1 mixture of methylisobutylketone and xylene which has no solving or gelatinizing action on cellulose ester. This solution also contains 0.3% of a sensitizer of the B.T.T.A. type. After a 5 seconds' exposure behind a halftone or line positive at 30 cm. from an MA. 125 Mazda lamp, the plate is washed-off with trichlorethylene and the triacetate is dyed by a solution of a dye of the Oxonel type in a 70/15/15 mixture of acetone, methanol and water, this composition being chosen to cause a slight swelling of the cellulose.

The image obtained can be kept as a print or can be used as a master sheet to obtain copies in an alcohol duplicating machine.

*Ex. 23.*—Sensitization and exposure being effected as in Example 22 the image can be washed-off in the presence of a dye solution in a solvent ensuring both the elimination of the unexposed light-sensitive resin and a slight swelling of the triacetate to make its dyeing possible (mixture of acetone and water for example).

*Ex. 24.*—A layer of cellulose triacetate colored by a dye of the Oxonal type is sensitized, exposed and washed-off as in Example 23. A direct positive image is obtained by transfer onto paper in an aclohol duplicating machine. A negative-positive ssytem can be obtained by dyeing the cellulosic sub-layer which is not protected by the reticulated lightsensitive resin.

*Ex. 25.*—A plastic plate of pigmented cellulose diacetate of the Rhodoid type is sensitized, exposed and washed-off as in Example 23; the plate is then treated by a 1:1 mixture of acetone and water for 30 seconds, then it is applied in contact with a sheet of paper. A direct positive image made of pigmented cellulose acetate is obtained by transfer, the exposed areas being protected against transfer by the lightsensitive resin which has become insoluble.

*Example 26*

This example illustrates an embodiment of the invention in which a product is used whose lightsensitive coating is hydrophilic and, consequently, may be washed away with water.

A gelatinized support (paper or film) is swabbed with cotton previously soaked with a 10% aqueous solution of poly(1,4-butanediol p-dimethylamino cinnamylidene malonate) methyliodide. After drying 1 minute at 60° C. in hot air, the sensitized paper is exposed for 1 minute at 30 cm. from an MA. 125 Mazda U.V. lamp, behind a halftone or line positive. The plate is washed off and dyed by a conventional dye transfer dyeing bath. The exposed lightsensitive resin is partially dyed by this type of dye; it must be removed by means of a wet swab of cotton in order to obtain the final image.

This direct positive image can be kept as such or transferred by wet contact onto a mordanted paper of the dye transfer type.

*Examples 27–28*

These examples illustrate an embodiment of the invention in which a good density is obtained without dyeing, by precipitating the underlying polymer in the form of fine light-diffusing droplets (coacervation). Such precipitation is obtained by swelling the underlying colloid in the areas bared by washing away the unexposed resin, and by precipitating it by a non-solvent. These two operations may be carried out simultaneously by suitably selecting the precipitation medium.

Among the underlayers capable of being used as a diffusing medium, zein is generally selected for the following reasons. It gives a transparent coating material that may be applied onto a subbed film support, it is capable of being coacervated by a water-alcohol mixture, giving a very diffusing and opaque layer, and it is insoluble in the coating and washing solvents of the photosensitive polyesters which are generally employed in accordance with the invention.

*Ex. 27.*—A subbed high acetyl cellulose acetate film is coated with a 20% zein solution in a mixture comprising 60 vol. of ethanol, 30 vol. of methanol, 10 vol. of water and about 2% of polyoxyethylene wax (Carbowax 800) which plays the part of a plasticizer. After drying in a dry atmosphere, a transparent coating is obtained having a thickness of 20–30$\mu$. The film is then sensitized with a 5% solution of butanediol 1–4 polycinnamylidene malonate in a mixture comprising xylene (1 vol.), methylisobutylketone (1 vol.) and also containing 0.45% of a sensitizer (methyl benzothiazolylidenedithioacetate). The lightsensitive coating is about 1$\mu$ thick. After exposing for 5 seconds at 30 cm. from a MA. 125 Mazda lamp under a line or halftone positive, the plate is developed with trichlorethylene, dried in hot air, then immersed during 5 seconds in a bath made of water (1 vol.) and ethanol (1 vol.). Zein sustains a microprecipitation in the bare areas, thus yielding a white image on a transparent background. By projection, a direct positive image is obtained and the image shows, by transmission, a density of about 0.4.

The definition obtained under such conditions is excellent but is dependent on the lateral diffusion of the precipitation medium in the zein coating (time of immersion in the water/alcohol bath).

*Ex. 28.*—A negative-positive system on paper can be made by first coating a waterproof black paper with a zein solution. After sensitization exposure development and treatment as set forth above, the image appears white on a black background, the contrast being a function of the thickness of the zein undercoat.

In the embodiment described in the last two examples, other colloid undercoats which are transparent but apt to be microprecipitated in an organic or even in an aqueous medium can be used. It is also possible to resort to other lightsensitive coatings, the only condition being that they must be applied without modifying the undercoating structure and adhere sufficiently to the latter during the washing-off operations.

A single-bath treatment can be imagined provided that the lightsensitive resin undercoat combination used is such that the washing-off solvent can coacervate zein.

Although the preceding examples have illustrated our invention with just the preferred polyester of cinnamylidene malonic acid and 1,4-butanediol, it will be understood as previously mentioned, that practical reproductions can also be obtained with any other of the mentioned resinous polyesters and other polymers. For example, the anthracene type of polyesters represented by above structural Formulas IV and V have good sensitivity and give in accordance with the invention excellent relief images for photomechanical reproductions. These polyesters may be prepared as follows:

A cold saturated solution of 9-hydroxymethyl anthracene in acetic acid was treated with concentrated hydrochloric acid to give 9-chloromethyl anthracene which was isolated by filtration. This was then condensed with one molecule compound, anthranylmethyl ethyl malonate represented by the formula:

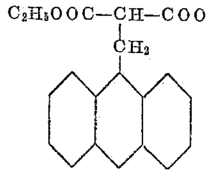

Then 8.75 g. of the above compound were heated with 6 g. of 1,4-butanediol in the presence of traces of butyl titanate as catalyst for four hours at 190° C. Ethyl alcohol was collected in theoretical quantity. Finally, the mixture was heated at 200° C. for seven more hours under reduced pressure (0.5 mm. of mercury). The resin obtained is represented by structural Formula IV. In the case of the resins represented by structural Formula V, these can be readily prepared by the general method described in British Patent No. 770,222, dated March 20, 1957.

What we claim is:

1. A photosensitive element for photomechanical reproductions consisting essentially of (1) a sheet support material selected from the group consisting of cellulose organic ester, polyethylene terephthalate and paper, (2) a colloid layer thereon of material selected from the group consisting of gelatin, zein, casein, albumin, gum arabic, polyvinyl alcohol, polyvinylpyrrolidone and cellulose acetophthalate, and (3) an over-coating layer of not more than about 5 microns in thickness over said colloid layer of a photosensitive polyester consisting essentially of the following recurring structural unit:

—OC—C—CO—O—R—O
‖
CH—CH=CH—$C_6H_5$ wherein R represents a hydrocarbon group containing from 2–12 carbon atoms, said colloid layer containing a component selected from the group consisting of ferric chloride, carbon black and ferrous sulfate admixed with a reducing agent selected from the group consisting of hydroxylamine hydrochloride, hydrazine sulfate and stannous chloride.

2. The photosensitive element for photomechanical reproductions according to claim 1 wherein the said support material is polyethylene terephthalate, wherein the said colloid of the colloid layer is gelatin, wherein the said overcoating layer of photosensitive resin is a polyester consisting essentially of the following recurring structural unit:

—OC—C—CO—O—$C_4H_8$—O—
‖
CH—CH=CH—$C_6H_5$

3. The photosensitive element for photomechanical reproduction according to claim 1 wherein the said support material is a baryta coated paper, wherein the said colloid of the colloid layer is gelatin, and wherein the said overcoating layer of photosensitive resin is a polyester consisting essentially of the following recurring structural unit:

—OC—C—CO—O—$C_4H_8$—O—
‖
CH—CH=CH—$C_6H_5$

4. The photosensitive element for photomechanical reproduction according to claim 1 wherein the said support material is cellulose triacetate, wherein the said colloid of the colloid layer is cellulose acetophthalate, and wherein the said overcoating layer of photosensitive resin is a polyester consisting essentially of the following recurring structural unit:

—OC—C—CO—O—$C_4H_8$—O—
‖
CH—CH=CH—$C_6H_5$

5. The photosensitive element for photomechanical reproductions according to claim 1 wherein the said support material is a baryta coated paper, wherein the said colloid of the colloid layer is cellulose acetophthalate, and wherein the said overcoating layer of photosensitive resin is a polyester consisting essentially of the following recurring structural unit:

—OC—C—CO—O—$C_4H_8$—O—
‖
CH—CH=CH—$C_6H_5$

6. The photosensitive element for photomechanical reproductions according to claim 1 wherein the said support material is a subbed cellulose triacetate, wherein the said colloid of the colloid layer is gelatin, and wherein the said overcoating layer of photosensitive resin is a polyester consisting essentially of the following recurring structural unit:

—OC—C—CO—O—$C_4H_8$—O—
‖
CH—CH=CH—$C_6H_5$

7. The photosensitive element for photomechanical reproductions according to claim 1 wherein the component in said colloid layer is carbon black.

8. The photosensitive element for photomechanical reproductions according to claim 1 wherein the component in said colloid layer is ferric chloride.

9. A process for preparing a printing matrix which consists of exposing to a subject a photosensitive element consisting essentially of (1) a support material selected from the group consisting of cellulose organic ester, polyethylene terephthalate and paper, (2) a colloid layer thereon of material selected from the group consisting of gelatin, zein, casein, albumin, gum arabic, polyvinyl alcohol, polyvinylpyrrolidone and cellulose acetophthalate, said colloid layer containing a component selected from a group consisting of ferric chloride, carbon black and ferrous sulfate admixed with a reducing agent selected from the group consisting of hydroxylamine hydrochloride, hydrazine sulfate and stannous chloride, and (3) an overcoating layer over said colloid layer of not more than about 5 microns in thickness of a photosensitive polyester, consisting essentially of the following recurring structural unit:

—OC—C—CO—O—R—O—
‖
CH—CH=CH—$C_6H_5$ wherein R represents a hydrocarbon group selected from the group containing from 2–12 carbon atoms, until said polyester is rendered insoluble in the region of exposure, and then removing said polyester from said colloid layer only in the unexposed region by means of a liquid solvent for only the said polyester.

10. The process according to claim 9 wherein the said support material is polyethylene terephthalate, wherein the said colloid of the colloid layer is gelatin and wherein the said overcoating layer of photosensitive resin is a polyester consisting essentially of the following recurring structural unit:

—OC—C—CO—O—$C_4H_8$—O—
‖
CH—CH=CH—$C_6H_5$

11. The process according to claim 9 wherein the said support material is paper, wherein the said colloid of the colloid layer is gelatin and wherein the said overcoating layer of photosensitive resin is a polyester consisting essentially of the following recurring structural unit:

—OC—C—CO—O—$C_4H_8$—O—
‖
CH—CH=CH—$C_6H_5$

12. The process according to claim 9 wherein the said material is cellulose triacetate, wherein the said colloid of its colloid layer is cellulose acetophthalate, and wherein the said overcoating layer of photosensitive resin comprises a polyester consisting essentially of the following recurring structural unit:

—OC—C—CO—O—$C_4H_8$—O—
‖
CH—CH=CH—$C_6H_5$

13. The process according to claim 9 wherein the said support material is a baryta coated paper, wherein the said colloid of the colloid layer is cellulose acetophthalate, and wherein the said overcoating layer of photosensitive resin is a polyester consisting essentially of the following recurring structural unit:

—OC—C—CO—O—$C_4H_8$—O—
‖
CH—CH=CH—$C_6H_5$

14. The process according to claim 9 wherein the said support material is a subbed cellulose triacetate, wherein the said colloid of the colloid layer is gelatin and wherein the said overcoating layer of photosensitive resin is a polyester consisting essentially of the following recurring structural unit:

$$-OC-\underset{\underset{CH-CH=CH-C_6H_5}{\|}}{C}-CO-O-C_4H_8-O-$$

15. The process of claim 9 wherein the said support material is cellulose triacetate, wherein the said colloid of the colloid layer is cellulose acetophthalate said component is carbon black, and wherein the said overcoating layer of photosensitive resin is a polyester consisting essentially of the following recurring structural unit:

$$-OC-\underset{\underset{CH-CH=CH-C_6H_5}{|}}{C}-CO-O-C_4H_8-O-$$

16. A photosensitive element for photomechanical reproductions consisting essentially of (1) a sheet support material selected from the group consisting of cellulose organic ester, polyethylene terephthalate and paper, (2) a colloid layer thereon of material selected from the group consisting of gelatin, zein, casein, albumin, gum arabic, polyvinyl alcohol, polyvinylpyrrolidone and cellulose acetophthalate, and (3) an overcoating layer of not more than about 5 microns in thickness over said colloid layer of a photosensitive polyester consisting essentially of the following recurring structural unit:

$$-OC-\underset{\underset{CH-CH=CH-C_6H_5}{\|}}{C}-CO-O-R-O-$$

wherein R represents a hydrocarbon group containing from 2–12 carbon atoms, said colloid layer containing ferrous sulfate admixed with a reducing agent selected from the group consisting of hydroxylamine hydrochloride, hydrazine sulfate and stannous chloride.

References Cited by the Examiner

UNITED STATES PATENTS

| | | | |
|---|---|---|---|
| 2,312,854 | 3/43 | Toland et al. | 96—33 X |
| 2,494,053 | 1/50 | Mitson et al. | 96—35 X |
| 2,568,503 | 9/51 | Kenyon et al. | 96—35 |
| 2,670,287 | 2/54 | Minsk et al. | 96—115 |
| 2,714,066 | 7/55 | Jewett et al. | 96—86 X |
| 2,756,143 | 7/56 | Murray | 96—28 |
| 2,764,085 | 9/56 | Shoemaker et al. | 96—33 X |
| 2,787,543 | 4/57 | Murray et al. | 96—115 |
| 2,801,233 | 7/57 | Minsk et al. | |
| 2,816,091 | 12/57 | Smith et al. | 96—115 |
| 2,852,371 | 9/58 | Kendall | 96—28 |
| 2,956,878 | 10/60 | Michiels et al. | 96—115 X |
| 2,975,053 | 3/61 | Schmidt et al. | |
| 2,983,606 | 5/61 | Rodgers | 96—29 |

FOREIGN PATENTS

| | | |
|---|---|---|
| 740,165 | 11/55 | Great Britain. |

OTHER REFERENCES

Dictionary of Photography, 18th Edition, Philosophical Library, New York, 1956, page 50.

NORMAN G. TORCHIN, *Acting Primary Examiner.*

HAROLD N. BURSTEIN, PHILIP E. MANGAN, ABRAHAM H. WINKELSTEIN, *Examiners.*

UNITED STATES PATENT OFFICE
CERTIFICATE OF CORRECTION

Patent No. 3,173,787 March 16, 1965

Pierre Clement et al.

It is hereby certified that error appears in the above numbered patent requiring correction and that the said Letters Patent should read as corrected below.

Column 2, line 70, for "cinnamylidne" read -- cinnamylidene --; columns 3 and 4, lines 14 to 25, formula (VI) should appear as shown below instead of as in the patent:

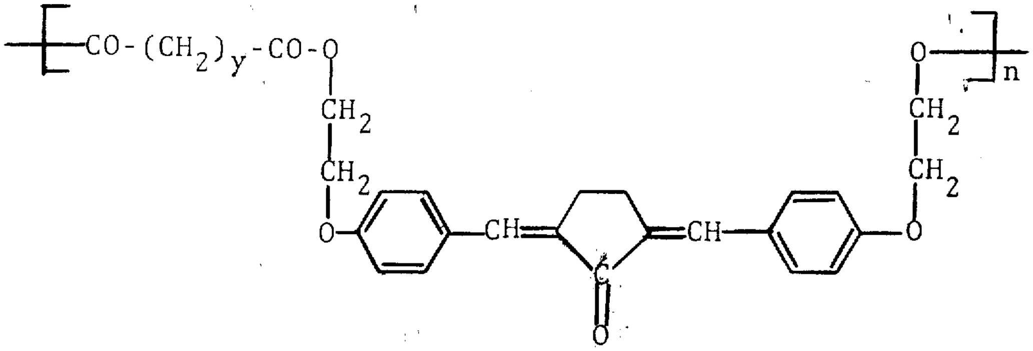

column 5, line 27, for "alkylendiol" read -- alkylenediol --; line 51, for "erosin" read -- eosin --; column 6, line 6, for "benbothiazolylidene" read -- benzothiazolylidene --; column 9, line 15, for "tinning" read -- tinting --; column 10, line 61, for "absorbes" read -- absorbs --; column 12, line 68, for "Examples 22-52", in italics, read -- Examples 22-25 --, in italics; column 13, line 28, for "ssytem" read -- system --.

Signed and sealed this 28th day of September 1965.

(SEAL)
Attest:

ERNEST W. SWIDER
Attesting Officer

EDWARD J. BRENNER
Commissioner of Patents